(12) United States Patent
Nayfeh et al.

(10) Patent No.: US 9,252,704 B2
(45) Date of Patent: Feb. 2, 2016

(54) VOLTAGE TUNABLE OSCILLATOR USING BILAYER GRAPHENE AND A LEAD ZIRCONATE TITANATE CAPACITOR

(75) Inventors: Osama M. Nayfeh, Adelphi, MD (US); Stephen James Kilpatrick, Olney, MD (US); James Wilson, Washington, DC (US); Madam Dubey, South River, NJ (US); Ronald G. Polcawich, Derwood, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 172 days.

(21) Appl. No.: 13/471,490

(22) Filed: May 15, 2012

(65) Prior Publication Data

US 2012/0293271 A1 Nov. 22, 2012

Related U.S. Application Data

(60) Provisional application No. 61/488,670, filed on May 20, 2011.

(51) Int. Cl.

| | |
|---|---|
| *H03B 5/12* | (2006.01) |
| *H01L 51/05* | (2006.01) |
| *H01L 49/02* | (2006.01) |
| *B82Y 10/00* | (2011.01) |
| *H03B 5/00* | (2006.01) |
| *H01L 51/00* | (2006.01) |

(52) U.S. Cl.
CPC .............. *H03B 5/1228* (2013.01); *B82Y 10/00* (2013.01); *H01L 28/55* (2013.01); *H01L 51/0558* (2013.01); *H03B 5/1203* (2013.01); *H03B 5/124* (2013.01); *H01L 51/0045* (2013.01); *H01L 2924/13088* (2013.01); *H03B 5/00* (2013.01); *H03B 5/12* (2013.01); *H03B 2200/0012* (2013.01)

(58) Field of Classification Search
CPC .......... H03B 5/00; H03B 5/12; H03B 5/1228; H03B 5/124; H03B 5/1203; H03B 2200/0012; H01L 2924/13088; H01L 51/0558; H01L 28/55; H01L 51/0045; B82Y 10/00
USPC .......... 331/36 C, 108 R, 117 R, 117 FE, 167; 257/E21.051
See application file for complete search history.

(56) References Cited

U.S. PATENT DOCUMENTS

| | | | | |
|---|---|---|---|---|
| 4,581,592 | A * | 4/1986 | Bennett | 331/107 A |
| 6,404,304 | B1 * | 6/2002 | Kwon et al. | 333/202 |
| 6,714,086 | B1 * | 3/2004 | Landrith et al. | 331/56 |
| 7,132,874 | B2 * | 11/2006 | McCorquodale et al. | 327/347 |
| 7,218,182 | B2 * | 5/2007 | Muramatsu | 331/177 V |
| 8,361,853 | B2 * | 1/2013 | Cohen et al. | 438/198 |
| 2010/0321857 | A1 * | 12/2010 | Habu et al. | 361/281 |
| 2011/0006837 | A1 * | 1/2011 | Wang et al. | 327/539 |
| 2011/0101309 | A1 * | 5/2011 | Lin et al. | 257/29 |
| 2011/0309372 | A1 * | 12/2011 | Xin et al. | 257/76 |
| 2012/0038429 | A1 * | 2/2012 | Haensch et al. | 331/117 FE |

* cited by examiner

*Primary Examiner* — Richard Tan
(74) *Attorney, Agent, or Firm* — Alan I. Kalb; Eric B. Compton

(57) ABSTRACT

A voltage controlled oscillator comprising a substrate and a bilayer graphene transistor formed on the substrate. The transistor has two signal terminals and a gate terminal positioned in between the signal terminals. A voltage controlled PZT or MEMS capacitor is also formed on the substrate. The capacitor is electrically connected to the transistor gate terminal. At least one component is connected to the transistor and capacitor to form a resonant circuit.

10 Claims, 4 Drawing Sheets

VOLTAGE TUNABLE OSCILLATOR USING BILAYER GRAPHENE AND A LEAD ZIRCONATE TITANATE CAPACITOR

This application claims benefit of U.S. Provisional Application No. 61/488,670 filed on May 20, 2011.

GOVERNMENT INTEREST

The invention described herein may be manufactured, used, and licensed by or for the United States Government.

BACKGROUND OF THE INVENTION

I. Field of the Invention

The present invention relates generally to voltage tunable oscillators and, more particularly, to a voltage tunable oscillator using bilayer graphene and a lead zirconate titanate capacitor.

II. Description of Related Art

Current electronic oscillators typically utilize transistors based on the silicon germanium or III-V systems coupled with silicon based MIM capacitors. These electronic oscillators, however, all suffer from common limitations.

One disadvantage of these previously known oscillators is that the electron mobility in these electronic transistor device systems is limited to their intrinsic values. Similarly, the capacitance of the silicon based MIM (Metal Insulator-Metal) capacitors is also limited. Together, these limitations restrict the overall performance and tunability of the oscillator. Furthermore, it is difficult to readily integrate both the transistors and the silicon based MIM capacitors on a single flexible substrate. This also limits the overall performance of these oscillators.

SUMMARY OF THE PRESENT INVENTION

The present invention provides a voltage tunable oscillator which overcomes all of the above mentioned disadvantages of the previously known devices.

In brief, the oscillator of the present invention includes a substrate of a semiconductor material, such as N+ silicon. A bilayer graphene transistor is then formed on the substrate and this graphene transistor includes two signal terminals, i.e. a drain and a source, on its opposite sides and a gate terminal in between.

A voltage controlled capacitor is also formed on the substrate and electrically connected to the gaphene transistor gate terminal. Preferably, the capacitor comprises lead zirconate titanate (PZT).

The PZT capacitor is a ferroelectric device so that the capacitance of the capacitor is varied by varying the voltage applied to the PZT capacitor. This, in turn, varies the oscillation frequency of the graphene transistor when excited by a single source so that the frequency of the output from the graphene transistor may be varied by varying the voltage control signal applied to the PZT capacitor.

Alternatively, the variable capacitor may be a MEMS device.

The oscillator also includes a resonant component, such as an inductor, connected to both the graphene transistor and the PZT capacitor. This component, together with the transistor and capacitor, form a resonant circuit.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF A PREFERRED EMBODIMENT OF THE PRESENT INVENTION

Figure 1:
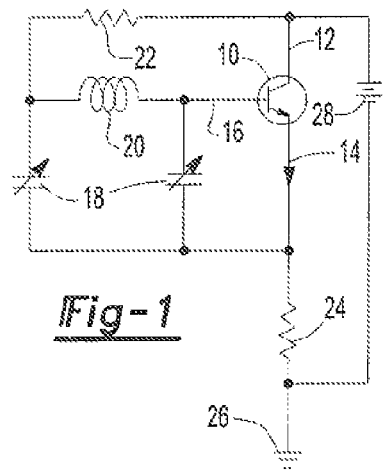
FIG. 1 is a circuit diagram illustrating a preferred embodiment of the present invention.

With reference first to FIG. 1, a schematic view of the voltage controlled oscillator of the present invention is shown and includes a GFET bilayer graphene transistor 10 having a source 12, drain 14, and gate 16. At least one, and preferably two or more capacitors 18 are disposed between the gate 16 and drain 14 of the transistor 10. In addition, a resonant component 20, such as an inductor, is electrically connected between the capacitors 18 and the transistor gate 16.

Still referring to FIG. 1, the oscillator of the present invention further includes a bias resistor 22 disposed between the transistor source 12 and one end of the inductor 20. Similarly, a load resistor 24 is electrically connected between the drain 14 and a ground 26. A power source 28 is connected between the source 12 of the transistor 10 and ground 26 to provide power for the oscillator.

Figure 2:
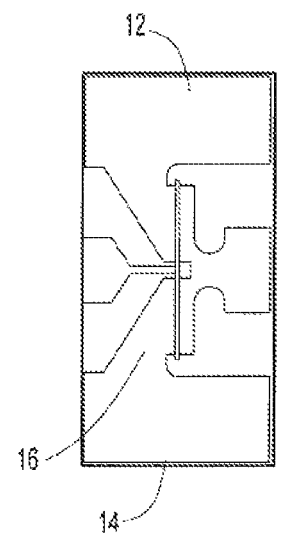
FIG. 2 is a top view of the GFET bilayer graphene transistor.
Figure 3:
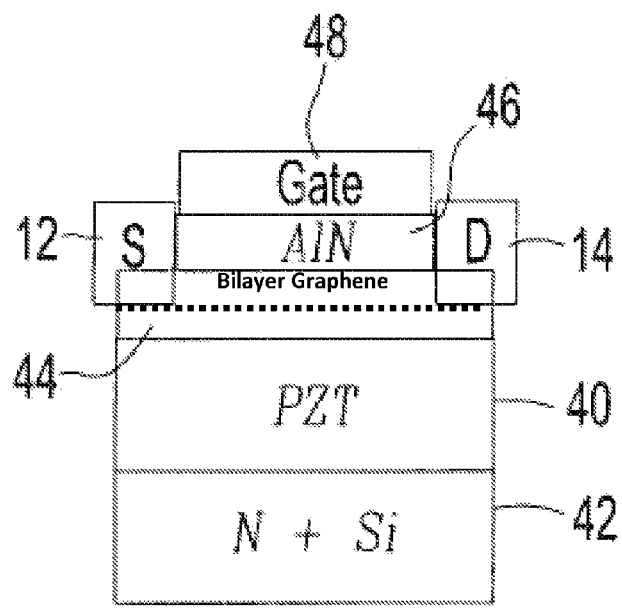
FIG. 3 is a diagrammatic cross-sectional view of the GFET transistor.

With reference now to FIGS. 2 and 3, FIG. 2 depicts a greatly magnified top view of the transistor 10 while FIG. 3 depicts a greatly magnified cross-sectional view of the transistor 10. FIG. 3 is not to scale.

The GFET (Graphene Field Effect Transistor) bilayer graphene transistor 10 is formed by depositing a PZT layer 40 on top of a N+ doped silicon substrate 42. A graphene layer 44 is then deposited on top of the PZT layer 40. The PZT layer 40 insulates the graphene layer 44 from the substrate 42. An aluminum nitride layer 46 is then deposited on a portion of the graphene layer 44 while leaving the source 12 and drain 14 exposed. A metal gate contact 48 is then deposited on the aluminum nitride layer 46 so that the gate 48 is insulated from a transistor element formed by the graphene layer 44 by the aluminum nitride layer 46.

Figure 5:
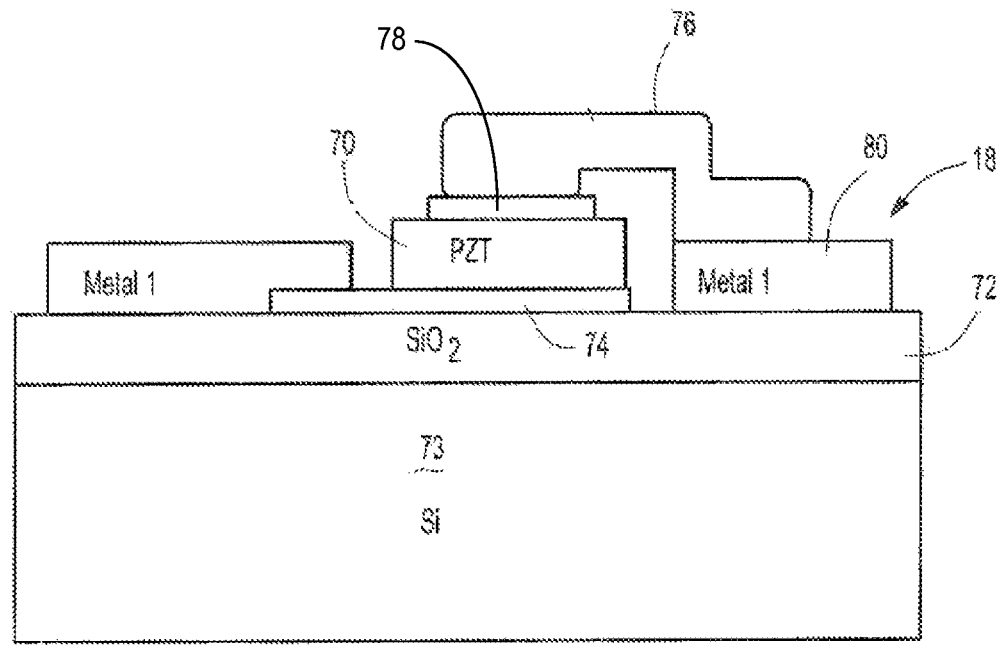
FIG. 5 is a cross-sectional view of the PZT capacitor.
Figure 6:
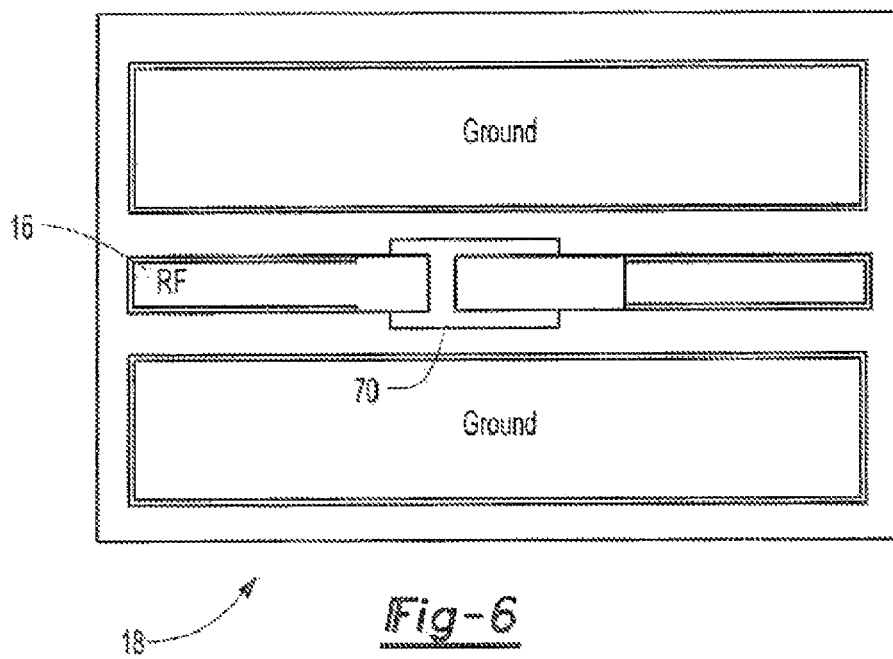
FIG. 6 is a top view of the PZT capacitor.

With reference now to FIGS. 5 and 6, a variable PZT capacitor 18 is illustrated in greater detail. The capacitor includes a PZT layer 70 attached to a silicon oxide layer 72 over a N+ silicon layer 73 by a metal layer 74. A variable voltage control line 76 is insulated from the PZT layer 70 by a metal layer 78. In practice, by varying the voltage on the control line 76 via a metal pad 80, the capacitance of the capacitor 18 is varied which in turn varies the oscillation frequency of the oscillator.

Figure 7:
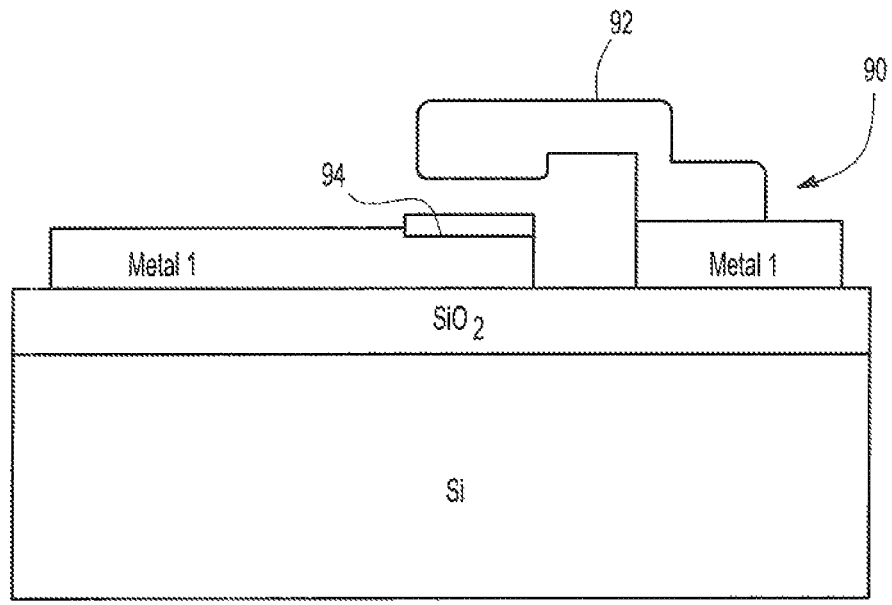
FIG. 7 is a cross-sectional view of a MEMS variable capacitor.
Figure 8:
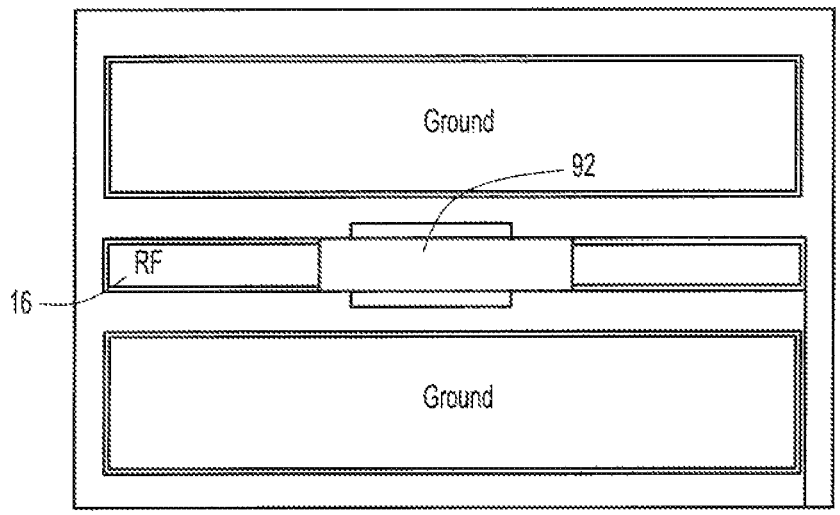
FIG. 8 is a top view of the MEMS variable capacitor.

FIGS. 7 and 8 illustrate a MEMS device 90 as a variable capacitor 18'. The MEMS device 90 includes a cantilever 92 in series with the RF signal line 16. The cantilever 92 overlies the RF line so that, upon application of a DC voltage, the cantilever 92 flexes and varies the capacitance of the capacitor 18'. Optionally, the capacitor 18' includes a dielectric layer 94.

It will be understood, of course, that the two capacitors 18 illustrated in FIG. 1 are by way of example only and that a single capacitor, or multiple capacitors, all based on PZT or a MEMS device, may be used to form the variable capacitor 18 or 18'.

With reference again to FIG. 1, the resonant component or inductor 20, as well as the biasing resistor 22 and load resistor 24, are all selected to form a resonant circuit when powered by the power source 28. Furthermore, the resonant frequency of the resonant circuit may be varied by varying the capacitance of the capacitors 18.

Figure 4:
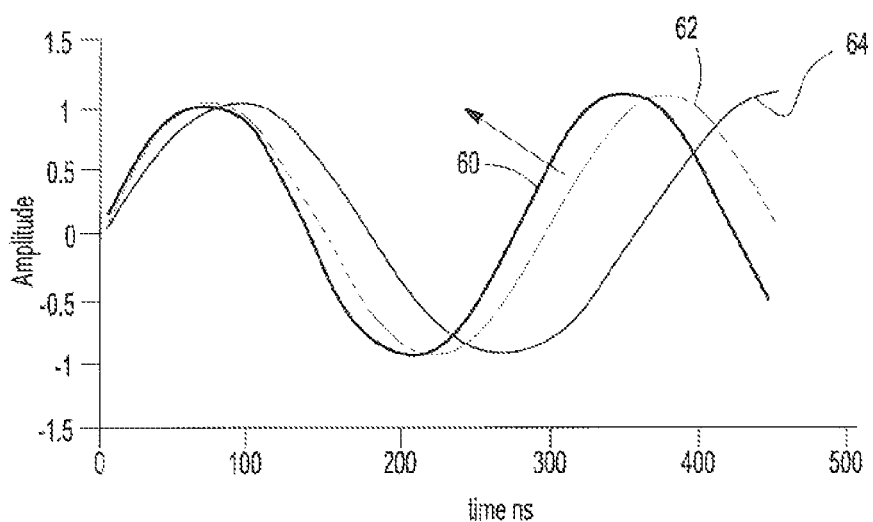
FIG. 4 is a graph illustrating the operation of the present invention.

With reference now to FIG. 4, three sinusoidal graphs 60, 62 and 64 are illustrated as a function of amplitude on the Y axis and time on the X axis. The three graphs 60, 62 and 64 all vary in frequency and this variance in frequency is achieved by varying the voltage on the control line 76 to the PZT capacitors 18.

A primary advantage of the voltage control variable oscillator of the present invention is that, since the graphene transistor exhibits high electron mobility, the transconductance of the transistor 14 is also very large thus enabling efficient operation at high frequencies. Similarly, the PZT MEMS capacitor 18 as well as the capacitor 18' exhibits an extremely high dielectric constant which enhances the overall efficiency and performance of the oscillator.

From the foregoing, it can be seen that the present invention provides a unique voltage control oscillator that overcomes many of the disadvantages of the previously known oscillators. Having described our invention however, many modifications thereto will become apparent to those skilled in the art to which it pertains without deviation from the spirit of the invention as defined by the scope of the appended claims.

We claim:

1. A voltage controlled oscillator comprising: a substrate, a voltage controlled variable capacitor comprising a layer of lead zirconate titanate (PZT) deposited on the substrate, a transistor comprising a layer of bilayer graphene formed on the same substrate as the PZT layer, and at least one component connected to said transistor and said voltage controlled variable capacitor to form a resonant circuit, wherein a first voltage applied to the voltage controlled variable capacitor adjusts piezoelectric and ferroelectric properties of the PZT layer so that capacitance of the voltage controlled variable capacitor thereof is varied, and varies an output frequency of the resonant circuit, and a second voltage applied to the transistor adjusts energy band gap of the bilayer graphene layer.

2. The voltage controlled oscillator as defined in claim 1, further comprising:
two signal terminals formed on the bilayer graphene layer.

3. The voltage controlled oscillator as defined in claim 2 further comprising: an insulating layer deposited on the bilayer graphene layer, and a gate terminal formed on, and being insulated from the bilayer graphene layer, the insulating layer.

4. The voltage controlled oscillator as defined in claim 3, wherein the insulating layer comprises aluminum nitride (AlN) which is deposited directly on the bilayer graphene layer.

5. The voltage controlled oscillator as defined in claim 1, wherein said at least one component comprises an inductor.

6. A method of forming the voltage controlled oscillator of claim 1, comprising: forming the voltage controlled variable capacitor including a step of depositing the layer of lead zirconate titanate (PZT) on the substrate; forming the transistor including a step of depositing the layer of bilayer graphene on the same substrate as the PZT layer; and connecting the at least one component to said transistor and said voltage controlled variable capacitor to form the resonant circuit.

7. A method of operating the voltage controlled oscillator of claim 1, comprising: varying an applied voltage to the PZT layer of the voltage controlled variable capacitor so that the capacitance thereof is varied to vary the output frequency of the resonant circuit.

8. The voltage controlled oscillator as defined in claim 1, wherein the layer of PZT of the voltage controlled variable capacitor is:
   (i) deposited on the substrate adjacent to the bilayer graphene layer; or
   (ii) deposited on the bilayer graphene layer with flip-chip bonding.

9. The voltage controlled oscillator as defined in claim 1, wherein the transistor comprises a layer of lead zirconate titanate (PZT).

10. The voltage controlled oscillator as defined in claim 1, wherein the voltage controlled variable capacitor is electrically connected to gate terminal of the transistor.

* * * * *